(12) United States Patent
Miyagi

(10) Patent No.: US 9,165,798 B2
(45) Date of Patent: *Oct. 20, 2015

(54) SUBSTRATE PROCESSING APPARATUS AND SUBSTRATE PROCESSING METHOD

(71) Applicant: Masahiro Miyagi, Kyoto (JP)

(72) Inventor: Masahiro Miyagi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 6 days.

This patent is subject to a terminal disclaimer.

(21) Appl. No.: 13/628,772

(22) Filed: Sep. 27, 2012

(65) Prior Publication Data

US 2013/0084710 A1    Apr. 4, 2013

(30) Foreign Application Priority Data

Sep. 29, 2011  (JP) ................................ P2011-215259

(51) Int. Cl.
*H01L 21/306* (2006.01)
*H01L 21/302* (2006.01)
*H01L 21/67* (2006.01)
*H01L 21/311* (2006.01)

(52) U.S. Cl.
CPC .... *H01L 21/67023* (2013.01); *H01L 21/31133* (2013.01)

(58) Field of Classification Search
USPC .......................... 156/345.11, 345.55; 134/902
See application file for complete search history.

(56) References Cited

U.S. PATENT DOCUMENTS

| | | | |
|---|---|---|---|
| 5,845,660 A * | 12/1998 | Shindo et al. | 134/56 R |
| 6,001,191 A * | 12/1999 | Kamikawa et al. | 134/32 |
| 6,109,278 A * | 8/2000 | Shindo et al. | 134/56 R |
| 6,227,212 B1 * | 5/2001 | Konishi et al. | 134/1.3 |
| 6,837,941 B2 * | 1/2005 | Hirooka et al. | 134/2 |
| 2004/0084301 A1 * | 5/2004 | Dordi et al. | 204/252 |
| 2008/0006302 A1 * | 1/2008 | Araki et al. | 134/26 |
| 2009/0211610 A1 * | 8/2009 | Honbe et al. | 134/26 |
| 2011/0079247 A1 | 4/2011 | Ma et al. | 134/18 |
| 2011/0089137 A1 | 4/2011 | Tanaka et al. | 216/13 |
| 2013/0084709 A1 * | 4/2013 | Miyagi et al. | 438/745 |
| 2013/0084710 A1 * | 4/2013 | Miyagi | 438/745 |
| 2014/0202496 A1 * | 7/2014 | Miyagi et al. | 134/18 |

FOREIGN PATENT DOCUMENTS

| | | |
|---|---|---|
| JP | 63-012391 | 1/1998 |
| JP | 2009-200365 | 9/2009 |
| JP | 2011-103438 | 5/2011 |
| JP | 2011-514684 | 5/2011 |
| JP | 2011-124383 | 6/2011 |

* cited by examiner

*Primary Examiner* — Sylvia R MacArthur
(74) *Attorney, Agent, or Firm* — Ostrolenk Faber LLP

(57) ABSTRACT

A substrate processing apparatus comprises a single-substrate processing apparatus for processing substrates one by one, and an anti-static liquid storage part for storing an anti-static liquid having electrical resistivity maintained at target electrical resistivity higher than the electrical resistivity of an SPM liquid. A plurality of substrates held in a cartridge are immersed in the anti-static liquid inside the anti-static liquid storage part and both main surfaces of the substrate entirely come into contact with the anti-static liquid. From the substrates, static electricity is relatively gently removed. Then, after the static elimination process are finished, a processing liquid supply part supplies the SPM liquid onto an upper surface of the substrate and an SPM process is thereby performed. It is thereby possible to prevent a large amount of electric charges from rapidly moving from the substrate to the SPM liquid and also possible to prevent any damage to the substrate.

14 Claims, 9 Drawing Sheets

SUBSTRATE PROCESSING APPARATUS AND SUBSTRATE PROCESSING METHOD

TECHNICAL FIELD

The present invention relates to a technique for processing a substrate.

BACKGROUND ART

In a process of manufacturing a semiconductor substrate (hereinafter, referred to simply as a "substrate"), conventionally, various processes are performed on a substrate having an insulating film such as an oxide film or the like thereon by using a substrate processing apparatus. By supplying a processing liquid onto a substrate having a surface on which a resist pattern is formed, for example, a process such as etching or the like is performed on the surface of the substrate. Further, after etching or the like is finished, a process of removing the resist from the substrate is also performed.

In a substrate processing apparatus disclosed in Japanese Patent Application Laid-Open No. 2009-200365, before the process using a processing liquid such as an SPM (sulfuric acid/hydrogen peroxide mixture) liquid or the like is performed, a liquid having electrical conductivity lower than the processing liquid is supplied to a processing area on a substrate and then the processing liquid is discharged to the processing area with the liquid existing therein. It is thereby possible, in the substrate processing apparatus, to prevent any local damage of the substrate due to the contact made between the substrate and the processing liquid. The local damage of the substrate refers to local destruction of a field oxide film or a gate oxide film in the processing area, and the destruction is caused by bringing the processing area on the substrate into contact with the processing liquid which is electrically charged by the frictional electrification phenomenon between the processing liquid and a processing liquid nozzle.

A substrate to be processed by a substrate processing apparatus is subjected to a drying process such as dry etching, plasma CVD (Chemical Vapor Deposition), or the like, before being loaded into the substrate processing apparatus. In such a drying process, since electric charges are generated in a device, the substrate which is electrically charged is loaded into the substrate processing apparatus. Then, in the substrate processing apparatus, when a processing liquid having low electrical resistivity, such as an SPM liquid, is supplied onto the substrate, the electric charges in the device rapidly move from the device to the processing liquid (in other words, the electric charges are discharged into the processing liquid) and damage may be caused in the device by heat generation due to the movement of the electric charges. Then, it is thought to be effective to remove static electricity from the substrate by using an ionizer before supplying the processing liquid onto the substrate, but when the amount of electrostatic charges on the substrate is too large, it is hard to efficiently remove static electricity from the substrate.

SUMMARY OF INVENTION

The present invention is intended for a substrate processing apparatus for processing a substrate, and it is an object of the present invention to prevent any damage to the substrate due to the movement of the electric charges in a process using a processing liquid.

The substrate processing apparatus according to the present invention comprises a substrate holding part for holding a substrate, a processing liquid supply part for supplying a processing liquid onto a first main surface which is one main surface of the substrate, an anti-static liquid contacting part for bringing the first main surface of the substrate and a second main surface which is the other main surface thereof into contact with an anti-static liquid having electrical resistivity higher than that of the processing liquid, and a control part for controlling the processing liquid supply part and the anti-static liquid contacting part to bring entire the first main surface and the second main surface of the substrate into contact with the anti-static liquid to thereby maintain a wetted state and to then supply the processing liquid onto the first main surface of the substrate to thereby perform a process. By the present invention, it is possible to prevent any damage to the substrate due to the movement of the electric charges in the process using the processing liquid.

In one preferred embodiment of the present invention, the anti-static liquid being in contact with the first main surface and the anti-static liquid being in contact with the second main surface are continuous with each other on the substrate.

Preferably, the anti-static liquid contacting part comprises an anti-static liquid storage part for storing the anti-static liquid therein, and the substrate is immersed in the anti-static liquid stored in the anti-static liquid storage part to thereby bring the first main surface and the second main surface into contact with the anti-static liquid.

More preferably, a plurality of substrates which are arranged so that the directions of the normals of respective main surfaces thereof are directed to a horizontal direction are immersed in the anti-static liquid stored in the anti-static liquid storage part.

In another preferred embodiment of the present invention, the anti-static liquid contacting part comprises a first anti-static liquid contacting part for supplying the anti-static liquid onto the first main surface of the substrate which is held by the substrate holding part with the first main surface thereof directed upward to thereby puddle entire the first main surface with the anti-static liquid, and a second anti-static liquid contacting part provided oppositely to the second main surface of the substrate, for discharging the anti-static liquid onto the second main surface to thereby maintain a contact state of entire the second main surface with the anti-static liquid.

In still another preferred embodiment of the present invention, the processing liquid is an SPM liquid in which sulfuric acid which is heated and hydrogen peroxide water are mixed, and the process is an SPM process.

In yet another preferred embodiment of the present invention, the substrate processing apparatus further comprises an electrical resistivity setting part for setting target electrical resistivity of the anti-static liquid, and in the substrate processing apparatus of yet another preferred embodiment of the present invention, the anti-static liquid is an ionic liquid or deionized water, and with control by the control part, the first main surface and the second main surface of the substrate are brought into contact with the anti-static liquid while the ion concentration of the anti-static liquid is controlled to maintain the electrical resistivity of the anti-static liquid at the target electrical resistivity.

Preferably, the target electrical resistivity set in the electrical resistivity setting part becomes higher as the size of a device formed on the substrate in advance becomes smaller.

More preferably, the anti-static liquid is the ionic liquid, and the ionic liquid is a solution in which carbon dioxide is dissolved in deionized water.

The present invention is intended for a substrate processing method of processing a substrate.

These and other objects, features, aspects and advantages of the present invention will become more apparent from the following detailed description of the present invention when taken in conjunction with the accompanying drawings.

DESCRIPTION OF EMBODIMENTS

Figure 1:
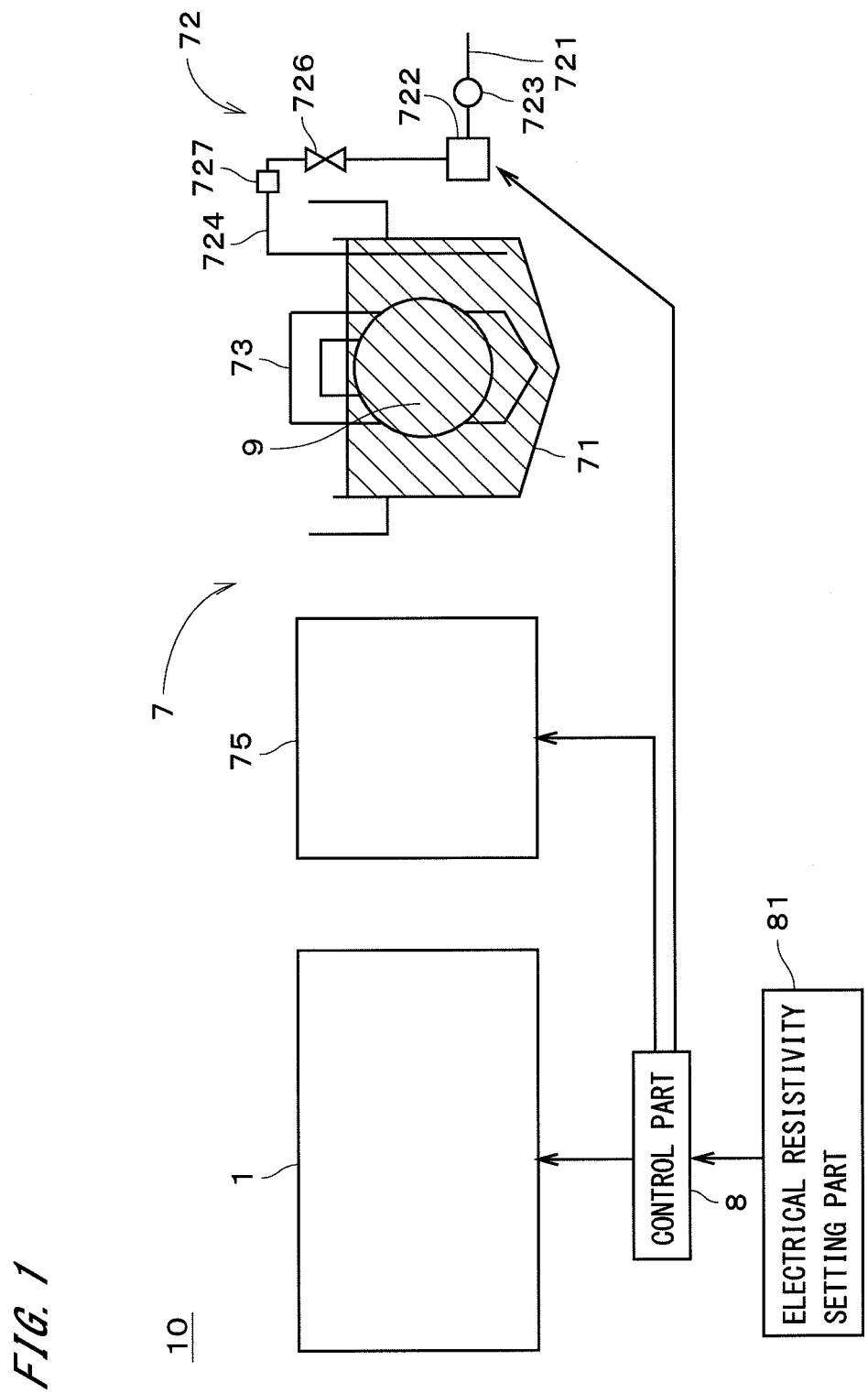
FIG. 1 is a view showing a configuration of a substrate processing apparatus in accordance with a first preferred embodiment of the present invention.

FIG. 1 is a view showing a configuration of a substrate processing apparatus 10 in accordance with the first preferred embodiment of the present invention. The substrate processing apparatus 10 is an apparatus for processing semiconductor substrates 9 (hereinafter, referred to simply as "substrates 9"). As shown in FIG. 1, the substrate processing apparatus 10 comprises a single-substrate processing apparatus 1 for processing substrates 9 one by one, an anti-static liquid contacting part 7 for bringing substrates 9 into contact with an anti-static liquid, an electrical resistivity setting part 81 for setting target electrical resistivity of the anti-static liquid, and a control part 8 for controlling these mechanisms. In the single-substrate processing apparatus 1, an SPM (sulfuric acid/hydrogen peroxide mixture) liquid is supplied onto the substrate 9, to thereby perform an SPM process, i.e., a process of removing a resist film from the substrate 9. Further, the electrical resistivity setting part 81 is connected to the control part 8.

Figure 2:
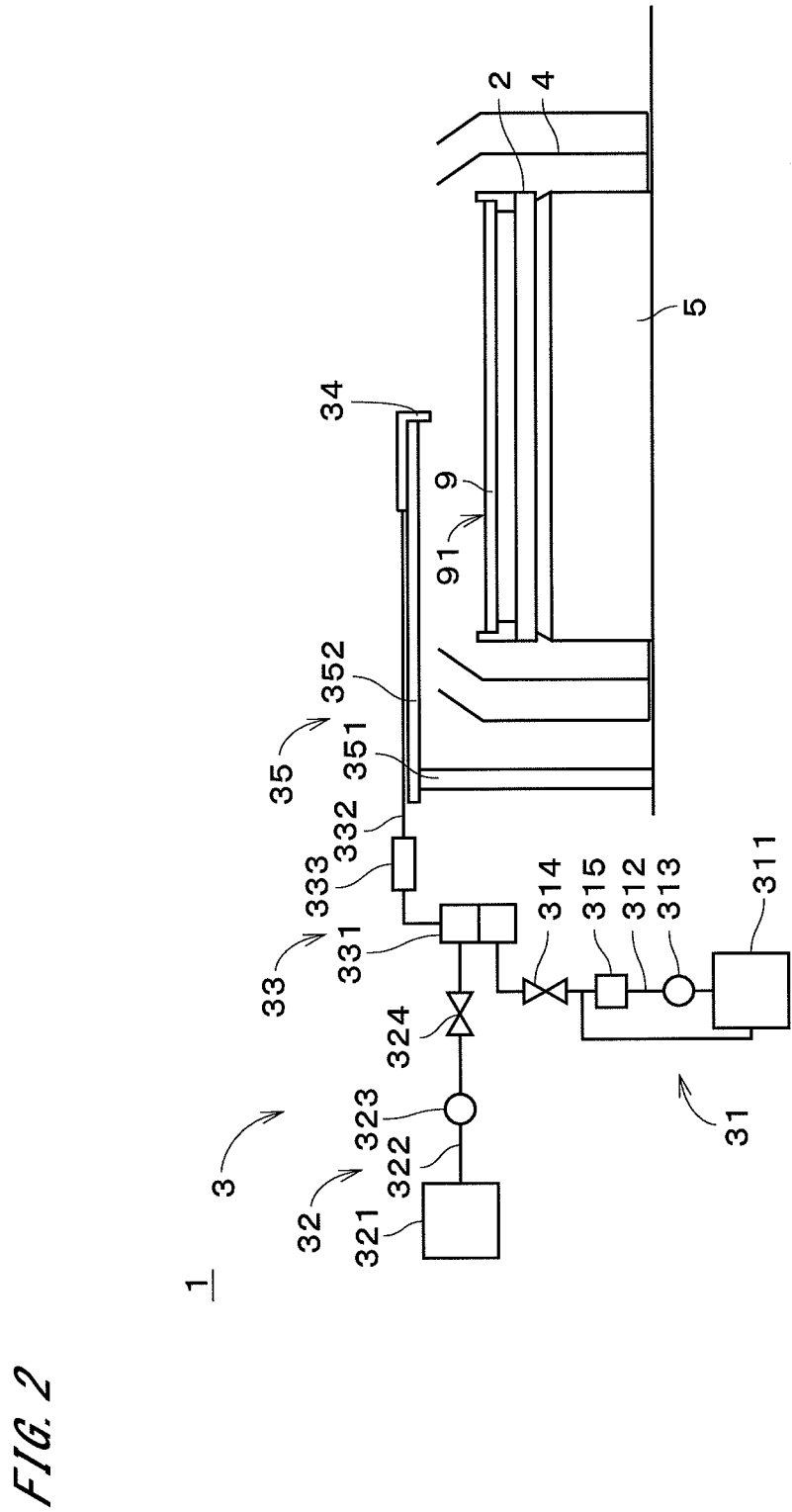
FIG. 2 is a view showing a configuration of a single-substrate processing apparatus.

FIG. 2 is a view showing a configuration of the single-substrate processing apparatus 1. The single-substrate processing apparatus 1 comprises a substrate holding part 2 for holding a substrate 9 with one main surface 91 (hereinafter, referred to as an "upper surface 91") thereof directed upward, a processing liquid supply part 3 for supplying a liquid such as an SPM liquid or the like onto the upper surface 91 of the substrate 9, a cup part 4 surrounding the periphery of the substrate 9 and the substrate holding part 2, and a substrate rotating mechanism 5 for horizontally rotating the substrate 9 together with the substrate holding part 2. The substrate 9 is held by the substrate holding part 2 so that the direction of the normal of the upper surface 91 is directed upward. The substrate 9 is rotated together with the substrate holding part 2 by the substrate rotating mechanism 5 about a rotation axis which goes through a center of the substrate 9 and is perpendicular to the upper surface 91 of the substrate 9. In the single-substrate processing apparatus 1, the substrate holding part 2, the cup part 4, the substrate rotating mechanism 5, and the like are accommodated in a not-shown chamber.

The processing liquid supply part 3 comprises a sulfuric acid supply part 31 for supplying sulfuric acid, a hydrogen peroxide water supply part 32 for supplying hydrogen peroxide water, a mixture generation part 33 connected to the sulfuric acid supply part 31 and the hydrogen peroxide water supply part 32, a processing liquid nozzle 34 disposed above the substrate 9, for discharging a liquid toward the substrate 9, and a processing liquid nozzle rotating mechanism 35 for horizontally rotating the processing liquid nozzle 34 about a rotation axis 351. The processing liquid nozzle rotating mechanism 35 comprises an arm 352 horizontally extending from the rotation axis 351, to which the processing liquid nozzle 34 is attached.

The sulfuric acid supply part 31 comprises a sulfuric acid storage part 311 for storing sulfuric acid therein, a sulfuric acid pipe 312 connected to the sulfuric acid storage part 311 and the mixture generation part 33, a sulfuric acid pump 313 for supplying the sulfuric acid from the sulfuric acid storage part 311 to the mixture generation part 33 through the sulfuric acid pipe 312, a sulfuric acid valve 314 provided on the sulfuric acid pipe 312, and a sulfuric acid heating part 315 provided on the sulfuric acid pipe 312 between the sulfuric acid pump 313 and the sulfuric acid valve 314, for heating the sulfuric acid. The sulfuric acid pipe 312 branches between the sulfuric acid heating part 315 and the sulfuric acid valve 314, being connected to the sulfuric acid storage part 311, and when the sulfuric acid valve 314 is closed, the sulfuric acid heated by the sulfuric acid heating part 315 circulates between the sulfuric acid storage part 311 and the sulfuric acid heating part 315.

The hydrogen peroxide water supply part 32 comprises a hydrogen peroxide water storage part 321 for storing hydrogen peroxide water therein, a hydrogen peroxide water pipe 322 connected to the hydrogen peroxide water storage part 321 and the mixture generation part 33, a hydrogen peroxide water pump 323 for supplying the hydrogen peroxide water from the hydrogen peroxide water storage part 321 to the mixture generation part 33 through the hydrogen peroxide water pipe 322, and a hydrogen peroxide water valve 324 provided on the hydrogen peroxide water pipe 322. The sulfuric acid storage part 311 and the hydrogen peroxide water storage part 321 may be provided outside the substrate processing apparatus 10, being connected to the sulfuric acid supply part 31 and the hydrogen peroxide water supply part 32, respectively.

The mixture generation part 33 comprises a mixing valve 331 to which the sulfuric acid pipe 312 and the hydrogen peroxide water pipe 322 are connected, a discharging pipe 332 connected to the mixing valve 331 and the processing liquid nozzle 34, and an mixing flow tube 333 provided on the discharging pipe 332. In the mixture generation part 33, the heated sulfuric acid supplied from the sulfuric acid supply part 31 and the hydrogen peroxide water of ordinary temperature (almost the same temperature as the room temperature) supplied from the hydrogen peroxide water supply part 32 are mixed in the mixing valve 331, to thereby generate an SPM liquid. The SPM liquid goes through the mixing flow tube 333 and the discharging pipe 332 and is transferred to the processing liquid nozzle 34. In the mixing flow tube 333, the SPM liquid is agitated to accelerate the chemical reaction of the sulfuric acid and the hydrogen peroxide water. The SPM liquid serving as a processing liquid is discharged from an outlet at a front end of the processing liquid nozzle 34 toward the upper surface 91 of the substrate 9. In the first preferred embodiment, the sulfuric acid heated to about 130° C. to 150°

C. by the sulfuric acid heating part 315 is supplied from the sulfuric acid supply part 31 to the mixture generation part 33. The temperature of the sulfuric acid to be supplied from the sulfuric acid supply part 31 may be changed as appropriate.

As shown in FIG. 1, the anti-static liquid contacting part 7 comprises an anti-static liquid storage part 71 for storing an anti-static liquid therein, an anti-static liquid supply part 72 for supplying the anti-static liquid to the anti-static liquid storage part 71, a cartridge 73 for holding a plurality of substrates 9, and a substrate drying part 75 for performing a vacuum drying process on the substrate 9. The anti-static liquid is a liquid having electrical resistivity higher than that of the SPM liquid which is the processing liquid used in the single-substrate processing apparatus 1. In the first preferred embodiment, an ionic liquid or deionized water (DIW) is used as the anti-static liquid, and as the ionic liquid, used is a solution in which carbon dioxide ($CO_2$) is dissolved in deionized water (the same applies to the following preferred embodiments). In FIG. 1, a cartridge moving part for holding and moving the cartridge 73 is not shown.

The anti-static liquid supply part 72 comprises a deionized water pipe 721 connected to a not-shown deionized water supply part, a carbon dioxide dissolution unit 722 connected to the deionized water pipe 721, a flowmeter 723 provided on the deionized water pipe 721, for measuring the amount of flow of deionized water, an anti-static liquid pipe 724 connected to the carbon dioxide dissolution unit 722, an anti-static liquid valve 726 provided on the anti-static liquid pipe 724, and an electrical resistivity meter 727 provided on the anti-static liquid pipe 724 between the anti-static liquid valve 726 and a front end of the anti-static liquid pipe 724.

The anti-static liquid discharged from the front end of the anti-static liquid pipe 724 is supplied to the anti-static liquid storage part 71 and stored therein. The electrical resistivity meter 727 measures the electrical resistivity of the anti-static liquid flowing in the anti-static liquid pipe 724. An output from the electrical resistivity meter 727 is sent to the control part 8. The target electrical resistivity of the anti-static liquid which is set by the electrical resistivity setting part 81, i.e., desirable electrical resistivity of the anti-static liquid in a static elimination process discussed later is sent to the control part 8 and stored therein in advance. The electrical resistivity setting part 81 stores a table indicating a relation between a size of a device formed on the substrate 9 in advance and target electrical resistivity of the anti-static liquid, and when a size of the device is inputted to the electrical resistivity setting part 81, the target electrical resistivity is set on the basis of the size and the table. In the electrical resistivity setting part 81, the smaller the size of the device formed on the substrate 9 in advance is (in other words, the smaller the minimum width of a wire of the device is), the larger the target electrical resistivity is set. In the first preferred embodiment, the target electrical resistivity is set in a range from 0.05 to 18 $M\Omega \cdot cm$ (megaohm-cm). When the target electrical resistivity is 18 $M\Omega \cdot cm$, carbon dioxide is not dissolved in the deionized water from the deionized water pipe 721 in the carbon dioxide dissolution unit 722, and the deionized water is supplied in the anti-static liquid storage part 71 as the anti-static liquid from the anti-static liquid pipe 724.

In the substrate processing apparatus 10, the carbon dioxide dissolution unit 722 of the anti-static liquid supply part 72 is feedback controlled by the control part 8 on the basis of the output from the electrical resistivity meter 727 (i.e., a measured value of the electrical resistivity of the anti-static liquid in the anti-static liquid pipe 724) and the above-described target electrical resistivity, and the amount of carbon dioxide to be dissolved in the deionized water from the deionized water pipe 721 is thereby controlled. In other words, the ion concentration of the anti-static liquid transferred from the carbon dioxide dissolution unit 722 to the anti-static liquid pipe 724 is controlled. The electrical resistivity of the anti-static liquid is thereby maintained at the target electrical resistivity. In more detail, by the above-discussed feedback control, the electrical resistivity of the anti-static liquid is maintained within a narrow range of the electrical resistivity which is substantially equal to the target electrical resistivity (as a matter of course, including the target electrical resistivity).

In the anti-static liquid contacting part 7, a plurality of substrates 9 are held in the cartridge 73 disposed above the anti-static liquid storage part 71 while being arranged so that main surfaces thereof may be in parallel to one another. Then, the cartridge moving part moves the cartridge 73 downwardly and the plurality of substrates 9 are immersed in the anti-static liquid stored in the anti-static liquid storage part 71 while being arranged so that the directions of the normals of the respective main surfaces thereof are directed to a horizontal direction.

In the substrate drying part 75, a vacuum drying process is performed on the substrate(s) 9 after being immersed in the anti-static liquid. In the substrate drying part 75, the vacuum drying process may be performed on the plurality of substrates 9 held in the cartridge 73 or on the substrates 9 detached from the cartridge 73 one by one. Further, in the substrate drying part 75, various methods other than the vacuum drying process may be used to perform a drying process. The substrate 9 after being subjected to the vacuum drying process is loaded into the single-substrate processing apparatus 1. In FIG. 1, a transfer mechanism or the like for transferring the substrate 9 between the substrate drying part 75 and the single-substrate processing apparatus 1 is not shown.

Figure 3:
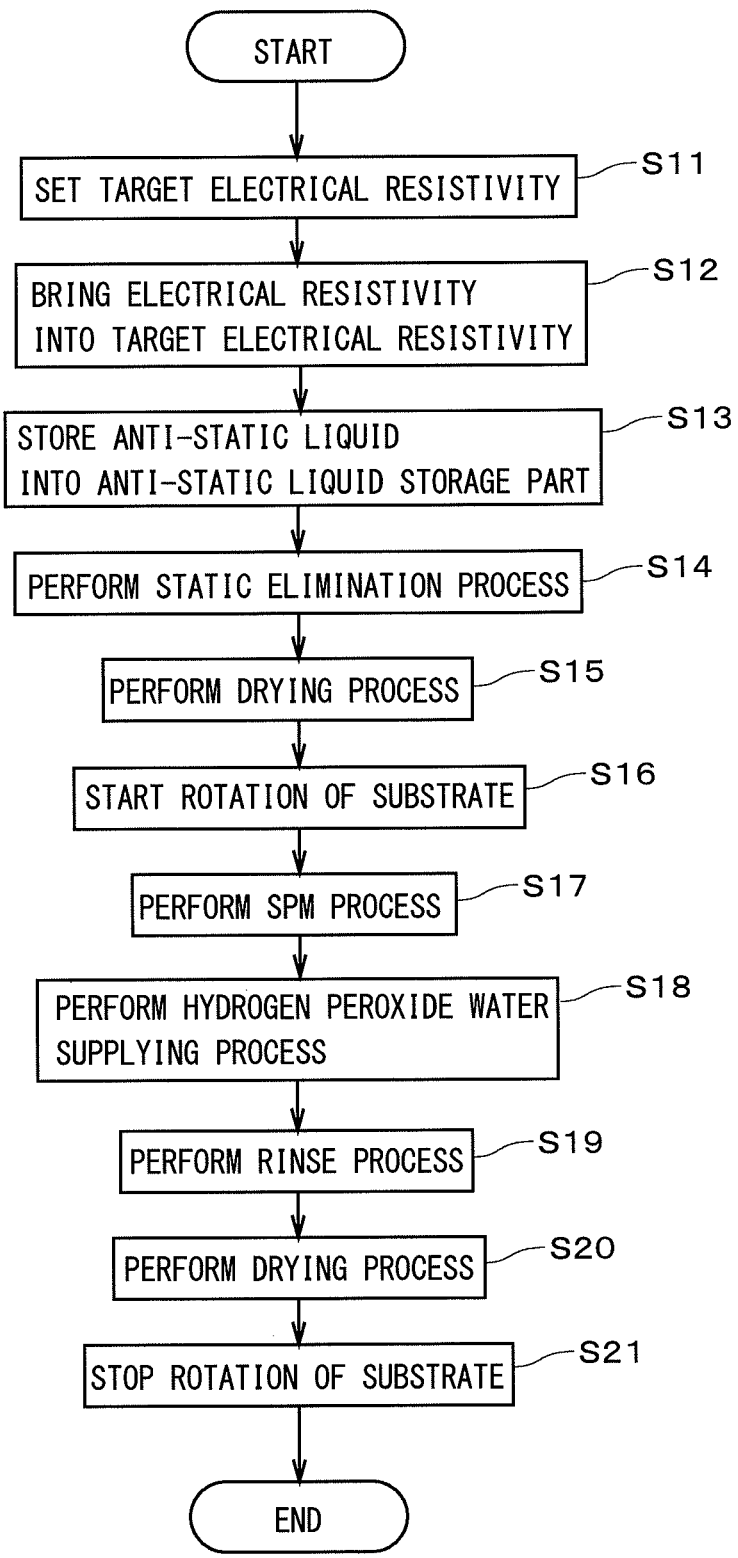
FIG. 3 is a flowchart showing an operation flow for processing a substrate.

FIG. 3 is a flowchart showing an operation flow for processing the substrate 9 in the substrate processing apparatus 10. First, the cartridge 73 holding a plurality of substrates 9 is loaded into the substrate processing apparatus 10. Before being loaded into the substrate processing apparatus 10, each of the substrates 9 is subjected to a drying process such as dry etching, plasma CVD (Chemical Vapor Deposition), or the like, and the substrate 9 is thereby electrically charged.

Subsequently, on the basis of the size of the device formed on the substrate 9 which is inputted in advance, the target electrical resistivity of the anti-static liquid is set by the electrical resistivity setting part 81 and stored in the control part 8 (Step S11). In the anti-static liquid contacting part 7, with the front end of the anti-static liquid pipe 724 directed to a position out of the anti-static liquid storage part 71, the control part 8 opens the anti-static liquid valve 726 and the anti-static liquid pipe 724 starts discharge of the anti-static liquid. Then, the feedback control is performed on the basis of the output from the electrical resistivity meter 727 and the target electrical resistivity, and the ion concentration of the anti-static liquid is controlled, to thereby bring the electrical resistivity of the anti-static liquid into the target electrical resistivity (Step S12). Next, the front end of the anti-static liquid pipe 724 is directed toward the anti-static liquid storage part 71, and the anti-static liquid is supplied from the anti-static liquid supply part 72 to the anti-static liquid storage part 71 by a predetermined amount and stored therein (Step S13).

After the supply of the anti-static liquid is finished, the cartridge moving part is controlled by the control part 8 to move the cartridge 73 disposed above the anti-static liquid storage part 71 downwardly toward the anti-static liquid storage part 71. Then, the plurality of substrates 9 held in the cartridge 73 are immersed in the anti-static liquid having electrical resistivity maintained at the target electrical resistivity inside the anti-static liquid storage part 71. Each of the substrates 9 is gradually immersed into the anti-static liquid from the lower portion of an edge thereof in a state of being held in the cartridge 73, and when the whole thereof is immersed, both of the main surfaces of the substrate 9 entirely come into contact with the anti-static liquid. Further, the anti-static liquid being in contact with one of the main surfaces of the substrate 9 and the anti-static liquid being in contact with the other main surface are continuous with each other on the edge of the substrate 9. Thus, by bringing the substrate 9 into contact with the anti-static liquid, the electric charges on the substrate 9 are relatively gently moved to the anti-static liquid. In the substrate processing apparatus 10, the state in which the substrate 9 is in contact with the anti-static liquid is kept for a predetermined time period and a static elimination process for the substrate 9 is thus performed (Step S14).

Figure 4:
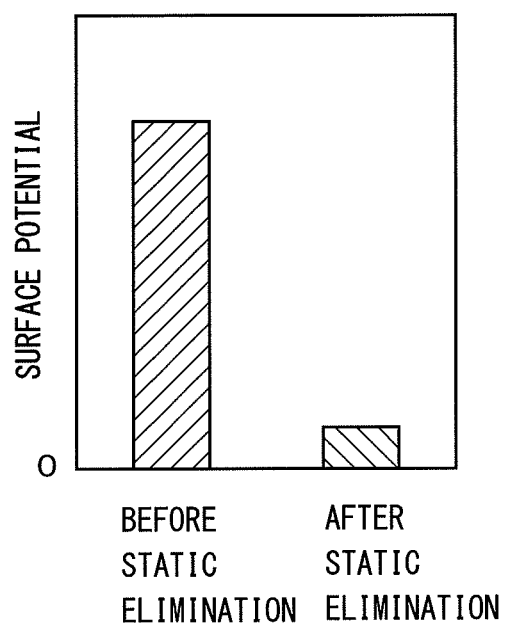
FIG. 4 is a graph showing surface potentials of a substrate before and after a static elimination process.

FIG. 4 is a graph showing surface potentials of the substrate 9 before and after the static elimination process in the substrate processing apparatus 10. FIG. 4 shows respective absolute values of the surface potentials at a center portion of the substrate 9 (the same applies to FIGS. 6 and 10). By performing the above-discussed static elimination process, the amount of the electric charges on the substrate 9 decreases and the potential of the substrate 9 is reduced on the whole. In the substrate processing apparatus 10, deionized water is used as the anti-static liquid when the size of the device formed on the substrate 9 is too small. Further, carbon dioxide ($CO_2$) water in which carbon dioxide is dissolved in deionized water is used as the anti-static liquid when the size of the device formed on the substrate 9 is relatively large (in other words, the substrate 9 has relatively high resistance to damage due to the movement of the electric charges). When the $CO_2$ water having electrical resistivity lower than deionized water is used as the anti-static liquid, the time required for the static elimination process can be reduced.

After the static elimination process on the substrate 9 is finished, the vacuum drying process is performed on the substrate 9 by the substrate drying part 75, to thereby remove the anti-static liquid from the substrate 9 (Step S15). Subsequently, one substrate 9 is loaded into the single-substrate processing apparatus 1 and held by the substrate holding part 2 with the upper surface 91 thereof directed upward. Next, the control part 8 controls the substrate rotating mechanism 5 to start rotation of the substrate 9 (Step S16). Further, the processing liquid nozzle rotating mechanism 35 starts rotation of the processing liquid nozzle 34 and the processing liquid nozzle 34 thereby repeats reciprocating motion between the center portion of the substrate 9 and the edge thereof.

Next, the control part 8 controls the processing liquid supply part 3 to open the sulfuric acid valve 314 of the sulfuric acid supply part 31, and the sulfuric acid in the sulfuric acid storage part 311, which is heated by the sulfuric acid heating part 315 up to about 130 to 150° C., is thereby supplied to the mixture generation part 33 through the sulfuric acid pipe 312. Further, the control part 8 opens the hydrogen peroxide water valve 324 and the hydrogen peroxide water of room temperature is thereby supplied from the hydrogen peroxide water storage part 321 to the mixing valve 331 through the hydrogen peroxide water pipe 322. In the mixing valve 331, the heated sulfuric acid and the hydrogen peroxide water of room temperature are mixed to generate the SPM liquid. The temperature of the SPM liquid is increased to, e.g., about 150 to 195° C. which is higher than the temperature of the sulfuric acid supplied from the sulfuric acid supply part 31, by the reaction of the sulfuric acid and the hydrogen peroxide water.

The SPM liquid goes through the discharging pipe 332 and the mixing flow tube 333 and is supplied from the processing liquid nozzle 34 onto the upper surface 91 of the substrate 9. In other words, the processing liquid supply part 3 supplies the heated sulfuric acid and the hydrogen peroxide water while being mixed, onto the upper surface 91 of the substrate 9. With the rotation of the substrate 9, the SPM liquid spreads over the entire upper surface 91 of the substrate 9 and is scattered out of the edge of the substrate 9 and received by the cup part 4. In the single-substrate processing apparatus 1, the SPM liquid is continuously supplied onto the substrate 9 for a predetermined time period, and the SPM process for the substrate 9, i.e., a process of removing the resist film on the substrate 9 with a strong oxidizing power of Caro's acid contained in the SPM liquid is performed (Step S17). Further, in the single-substrate processing apparatus 1, the SPM liquid or the like may be supplied from the processing liquid nozzle 34 which stays still above the center portion of the substrate 9.

After the SPM process is finished, the sulfuric acid valve 314 is closed while the hydrogen peroxide water valve 324 remains open, and the hydrogen peroxide water goes through the mixing valve 331, the discharging pipe 332, and the mixing flow tube 333 and is supplied from the processing liquid nozzle 34 onto the substrate 9 from which the resist film is removed (Step S18). By performing the hydrogen peroxide water supplying process, the SPM liquid which remains in the mixing valve 331, the discharging pipe 332, the mixing flow tube 333, and the processing liquid nozzle 34 is removed. With the rotation of the substrate 9, the hydrogen peroxide water supplied onto the substrate 9 spreads over the entire upper surface 91 of the substrate 9 and the SPM liquid remaining on the substrate 9 is thereby pushed out of the edge of the substrate 9 and removed therefrom.

After the hydrogen peroxide water supplying process is finished, the hydrogen peroxide water valve 324 is closed to stop the supply of the hydrogen peroxide water, and the processing liquid nozzle rotating mechanism 35 moves the processing liquid nozzle 34 to a waiting position outside the substrate 9. Next, a rinse process is performed, in which a rinse liquid is supplied from a not-shown rinse liquid supply part onto the upper surface 91 of the substrate 9 (Step S19). As the rinse liquid, deionized water is used. With the rotation of the substrate 9, the rinse liquid spreads over the entire upper surface 91 of the substrate 9. The hydrogen peroxide water remaining on the substrate 9 is thereby rinsed. After the rinse process is continuously performed for a predetermined time period, the supply of the rinse liquid is stopped. Then, the number of revolutions of the substrate 9 is increased, and a drying process for removing the rinse liquid remaining on the substrate 9 with the rotation of the substrate 9 is performed (Step S20). After that, the rotation of the substrate 9 is stopped (Step S21), and the substrate 9 is unloaded from the substrate processing apparatus 10.

Thus, in the substrate processing apparatus 10, before the SPM process using the SPM liquid is performed, both of the main surfaces of the substrate 9 which is electrically charged by the preprocess such as dry etching, plasma CVD, or the like are brought into entire contact with anti-static liquid having electrical resistivity higher than that of the SPM liquid and kept wetted. From both the entire main surfaces of the substrate 9, static electricity is thereby relatively gently removed. Since there arises no heat generation due to rapid movement of the electric charges from the substrate 9 to the anti-static liquid in the static elimination, it is possible to prevent any damage to the device formed on the substrate 9.

Then, since the SPM liquid is supplied onto the substrate 9 from which static electricity is removed, there arises no rapid movement of a large amount of electric charges from the substrate 9 to the SPM liquid even when the substrate 9 is brought into contact with the SPM liquid having electrical resistivity lower than that of the anti-static liquid, and it is therefore possible to prevent any damage to the device due to the movement of the electric charges, i.e., any damage to the substrate 9 also in the SPM process using the SPM liquid. In the anti-static liquid contacting part 7, the anti-static liquid being in contact with one of the main surfaces of the substrate 9 and the anti-static liquid being in contact with the other main surface are continuous with each other on the substrate 9. It is thereby possible to reduce (the absolute value of) the surface potential of the substrate 9 by the static elimination process as compared with a case where the anti-static liquid being in contact with one of the main surfaces of the substrate 9 and the anti-static liquid being in contact with the other main surface are not continuous with each other. Further, in the anti-static liquid contacting part 7, since the whole of the substrate 9 is immersed in the anti-static liquid, it is possible to easily increase the amount of anti-static liquid to be brought into contact with the substrate 9 per unit area and possible to further reduce (the absolute value of) the surface potential of the substrate 9.

In the anti-static liquid contacting part 7, since a plurality of substrates 9 are immersed in the anti-static liquid inside the anti-static liquid storage part 71 at a time, the static elimination of a plurality of substrates 9 can be performed with high efficiency. Further, since it is not necessary to frequently supply the anti-static liquid into the anti-static liquid storage part 71, it is possible to suppress generation of electric charges in the anti-static liquid by friction between the anti-static liquid and the anti-static liquid pipe 724. Furthermore, since each of the substrates 9 is gradually immersed from the edge thereof, even if damage is caused to the substrate 9 by the movement of the electric charges from the substrate 9 to the anti-static liquid, the damage is caused only to the edge and its vicinity of the substrate 9 which has little effect on the device formed on the substrate 9. Therefore, it is possible to increase the yield.

In the substrate processing apparatus 10, by bringing both the main surfaces of the substrate 9 into contact with the anti-static liquid while maintaining the electrical resistivity of the anti-static liquid at the target electrical resistivity by controlling the anti-static liquid contacting part 7, it is possible to increase the static elimination efficiency of the substrate 9 and shorten the time required for the static elimination process within the limits of causing no damage to the substrate 9. Further, since the electrical resistivity setting part 81 sets larger target electrical resistivity as the size of the device formed on the substrate 9 becomes smaller, both preventing any damage to the substrate 9 in the SPM process and shortening the time required for the static elimination process can be achieved compatibly in accordance with the size of the device. Furthermore, by controlling the amount of carbon dioxide to be dissolved in deionized water in the carbon dioxide dissolution unit 722, it is possible to easily control the electrical resistivity of the anti-static liquid.

Figure 5:
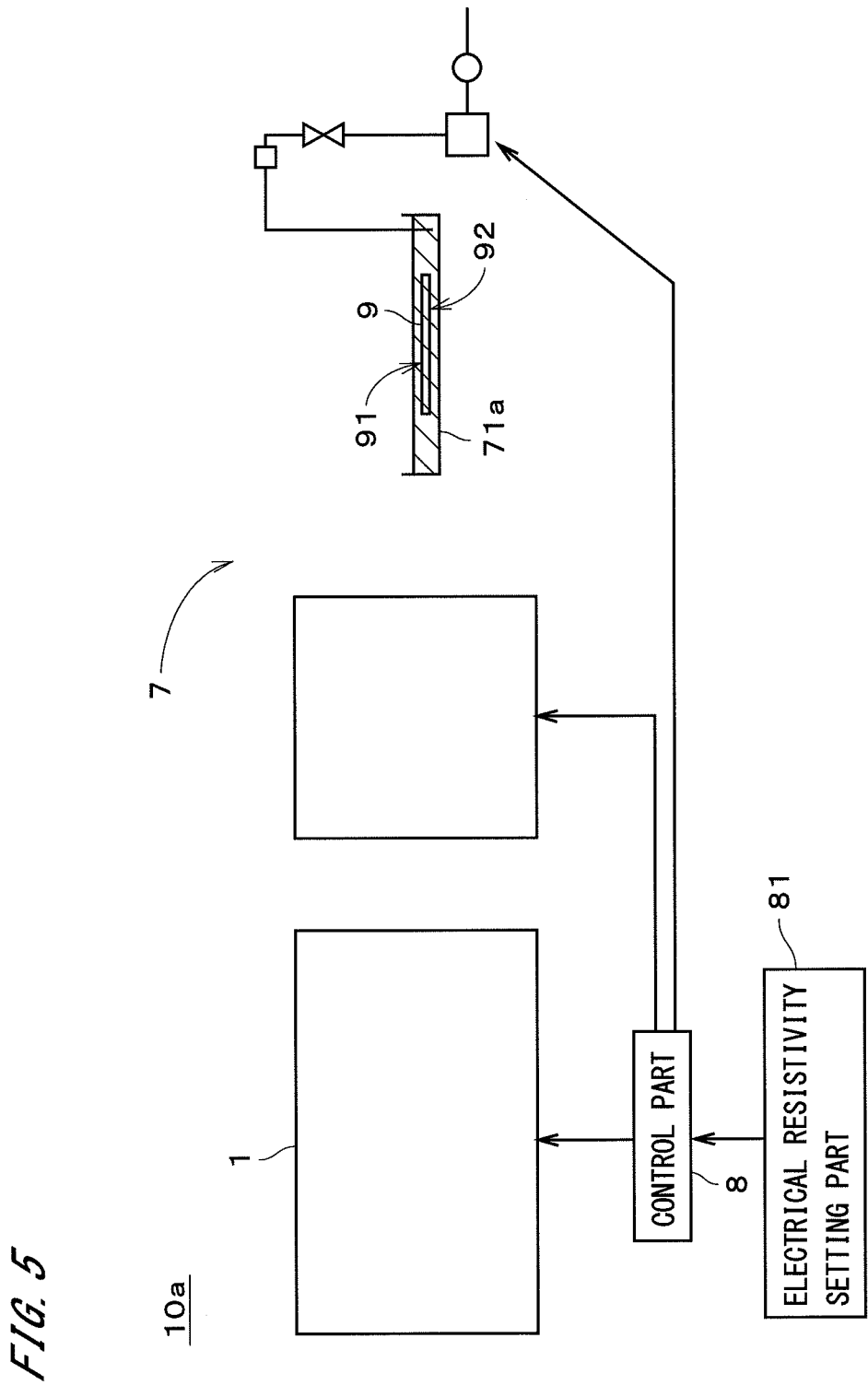
FIG. 5 is a view showing a configuration of a substrate processing apparatus in accordance with a second preferred embodiment of the present invention.

Next, discussion will be made on a substrate processing apparatus 10*a* of the second preferred embodiment of the present invention. FIG. 5 is a view showing a configuration of the substrate processing apparatus 10*a*. In the substrate processing apparatus 10*a*, an anti-static liquid storage part 71*a* in which only one substrate 9 can be immersed is provided, instead of the anti-static liquid storage part 71 shown in FIG. 1, and the cartridge 73 and the cartridge moving part are omitted in the anti-static liquid contacting part 7. The constituent elements other than the above are identical to those in the substrate processing apparatus 10 of FIG. 1 and the corresponding elements are represented by the same reference signs in the following discussion.

An operation flow of the substrate processing apparatus 10*a* is almost the same as that shown in FIG. 3, except that one substrate 9 is immersed in the anti-static liquid inside the anti-static liquid storage part 71*a* by the control of the control part 8 from a main surface (hereinafter, referred to as a "lower surface 92") of the substrate 9 which is the reverse side of the upper surface 91.

Figure 6:
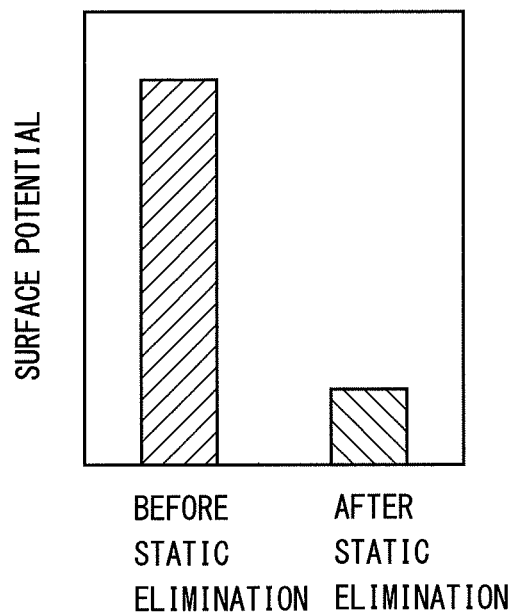
FIG. 6 is a graph showing surface potentials of the substrate before and after the static elimination process.

FIG. 6 is a graph showing surface potentials of the substrate 9 before and after the static elimination process in the substrate processing apparatus 10*a*. By performing the above-discussed static elimination process, the amount of the electric charges on the substrate 9 decreases and the potential of the substrate 9 is reduced on the whole. It is therefore possible to prevent any damage to the device due to the movement of the electric charges, i.e., any damage to the substrate 9 in the SPM process by the single-substrate processing apparatus 1 on the substrate 9 after being subjected to the static elimination process, like in the substrate processing apparatus 10 of FIG. 1. Further, in the anti-static liquid contacting part 7, the anti-static liquid being in contact with the upper surface 91 of the substrate 9 and the anti-static liquid being in contact with the lower surface 92 thereof are continuous with each other on the substrate 9. It is thereby possible to reduce (the absolute value of) the surface potential of the substrate 9 by the static elimination process. Furthermore, in the anti-static liquid contacting part 7, since the whole of the substrate 9 is immersed in the anti-static liquid, it is possible to further reduce (the absolute value of) the surface potential of the substrate 9.

Figure 7:
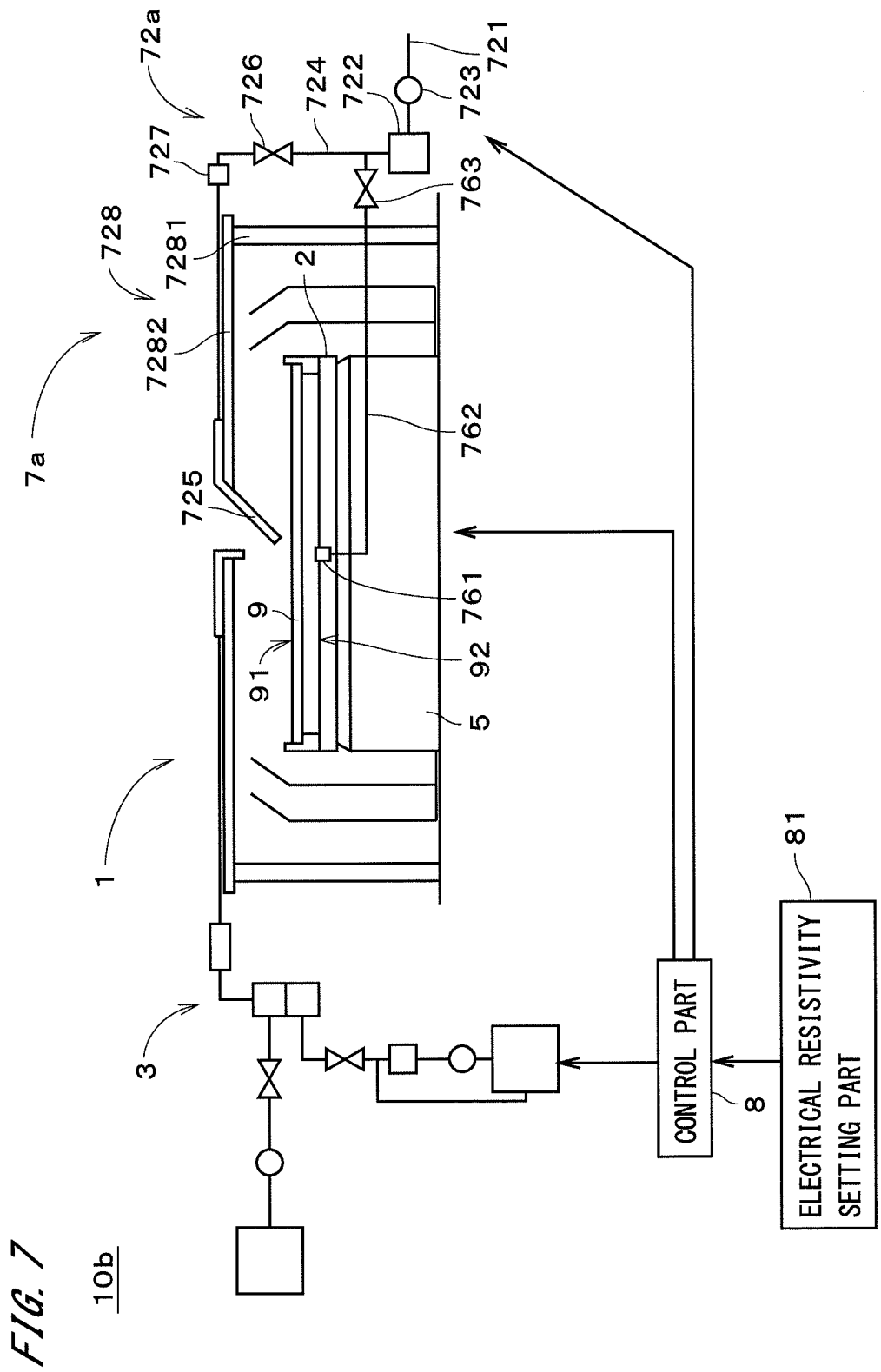
FIG. 7 is a view showing a configuration of a substrate processing apparatus in accordance with a third preferred embodiment of the present invention.

Next, discussion will be made on a substrate processing apparatus 10*b* of the third preferred embodiment of the present invention. FIG. 7 is a view showing a configuration of the substrate processing apparatus 10*b*. In the substrate processing apparatus 10*b*, an anti-static liquid contacting part 7*a* is provided in the single-substrate processing apparatus 1, instead of the anti-static liquid contacting part 7. In the anti-static liquid contacting part 7*a*, the anti-static liquid storage part, the substrate drying part, and the like are omitted but an anti-static liquid supply part 72*a* having a structure partially different from that of the anti-static liquid supply part 72 shown in FIG. 1 is provided. The constituent elements other than the above are identical to those in the substrate processing apparatus 10 of FIG. 1 and the corresponding elements are represented by the same reference signs in the following discussion.

Like the anti-static liquid supply part 72 shown in FIG. 1, the anti-static liquid supply part 72*a* comprises the deionized water pipe 721, the carbon dioxide dissolution unit 722, the flowmeter 723, the anti-static liquid pipe 724, the anti-static liquid valve 726, and the electrical resistivity meter 727. The anti-static liquid supply part 72*a* further comprises an anti-static liquid nozzle 725 provided at the front end of the anti-static liquid pipe 724 and an anti-static liquid nozzle rotating mechanism 728 for horizontally rotating the anti-static liquid nozzle 725 about a rotation axis 7281. The anti-static liquid nozzle rotating mechanism 728 comprises an arm 7282 horizontally extending from the rotation axis 7281, to which the anti-static liquid nozzle 725 is attached.

In the single-substrate processing apparatus 1, parts of an outer edge of the substrate 9 are supported by the substrate holding part 2 and the lower surface 92 of the substrate 9 and the substrate holding part 2 are spaced from each other except the parts of the substrate 9 which are in contact with the substrate holding part 2. The anti-static liquid supply part 72a further comprises a lower surface liquid-contacting part 761 provided at a position of the substrate holding part 2 which is opposed to a center portion of the lower surface 92 of the substrate 9, for supplying the anti-static liquid onto the lower surface 92 of the substrate 9. The lower surface liquid-contacting part 761 is connected to the anti-static liquid pipe 724 through a lower surface pipe 762, and a lower surface valve 763 is provided on the lower surface pipe 762.

In the anti-static liquid contacting part 7a, with control by the control part 8, the anti-static liquid having electrical resistivity maintained at the target electrical resistivity is transferred to the anti-static liquid nozzle 725 and the lower surface liquid-contacting part 761, and the anti-static liquid is supplied onto the upper surface 91 of the substrate 9 from an outlet at a front end of the anti-static liquid nozzle 725 which is directed toward the center portion of the upper surface 91 of the substrate 9 and the anti-static liquid is also supplied onto the lower surface 92 of the substrate 9 from the lower surface liquid-contacting part 761 opposed to the center portion of the lower surface 92 of the substrate 9. Assuming that the anti-static liquid nozzle 725 and the lower surface liquid-contacting part 761 are referred to as a first anti-static liquid contacting part and a second anti-static liquid contacting part, respectively, in the anti-static liquid contacting part 7a, the upper surface 91 and the lower surface 92 of the substrate 9 are brought into contact with the anti-static liquid by the first anti-static liquid contacting part and the second anti-static liquid contacting part, respectively.

Figure 8:
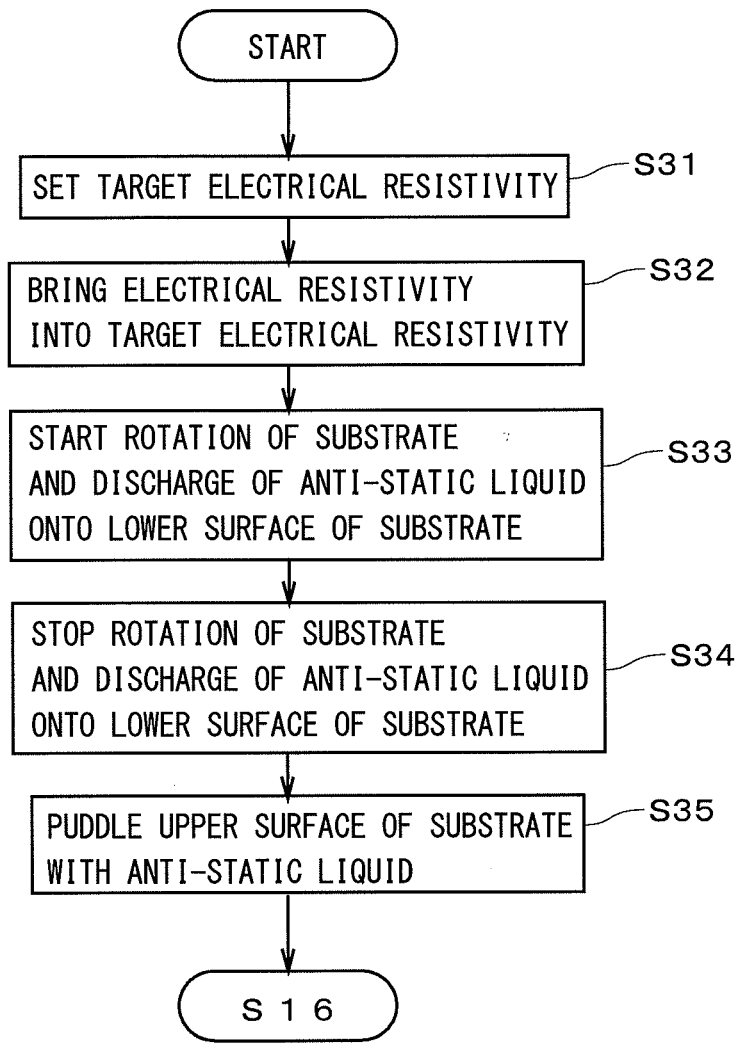
FIG. 8 is a flowchart showing a partial operation flow for processing a substrate.

FIG. 8 is a flowchart showing a partial operation flow for processing the substrate 9 in the substrate processing apparatus 10b. First, the electrically charged substrate 9 is loaded into the single-substrate processing apparatus 1 and held by the substrate holding part 2 therein. Subsequently, like in the substrate processing apparatus 10 of FIG. 1, the target electrical resistivity of the anti-static liquid is set by the electrical resistivity setting part 81 and stored in the control part 8 (Step S31). Then, the discharge of the anti-static liquid is started while the anti-static liquid nozzle 725 is positioned at a waiting position outside the substrate 9, and the ion concentration of the anti-static liquid is controlled on the basis of the output from the electrical resistivity meter 727 and the target electrical resistivity. The electrical resistivity of the anti-static liquid is thereby brought into the target electrical resistivity (Step S32).

Figure 9:
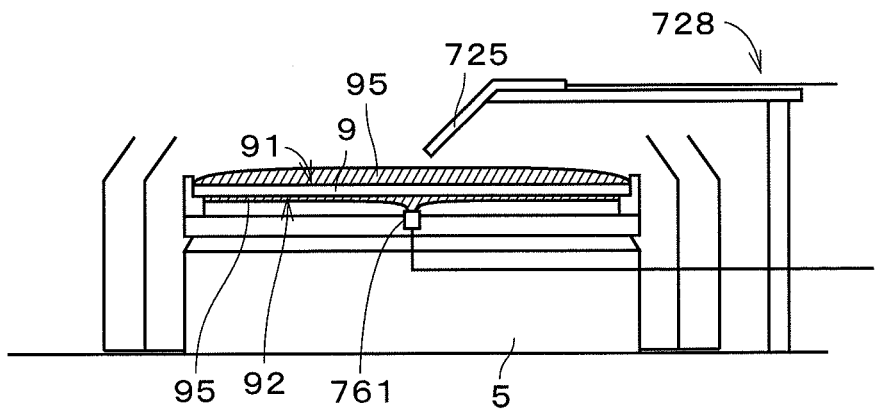
FIG. 9 is a view showing an anti-static liquid on the substrate.

Next, the substrate rotating mechanism 5 starts rotation of the substrate 9, and as shown in FIG. 9, the discharge of an anti-static liquid 95 having electrical resistivity maintained at the target electrical resistivity is started from the outlet at a front end of the lower surface liquid-contacting part 761 toward the lower surface 92 of the substrate 9 (Step S33). The rotation speed of the substrate 9 is lower than that in the SPM process discussed later. With the rotation of the substrate 9, the anti-static liquid 95 coming into contact with the lower surface 92 of the substrate 9 spreads from the center portion of the lower surface 92 of the substrate 9 over the entire lower surface 92. After the anti-static liquid 95 spreads over the entire the lower surface 92 of the substrate 9, the discharge of the anti-static liquid 95 and the rotation of the substrate 9 are stopped (Step S34). The state in which the entire lower surface 92 of the substrate 9 (except the contact portion with the substrate holding part 2) is in contact with the anti-static liquid 95 is thereby maintained, and as a result, the electric charges on the lower surface 92 of the substrate 9 are relatively gently moved to the anti-static liquid 95 and the static elimination process is thus performed on the entire lower surface 92 of the substrate 9.

After the supply of the anti-static liquid 95 onto the lower surface 92 of the substrate 9 is finished, the anti-static liquid nozzle rotating mechanism 728 moves the anti-static liquid nozzle 725 from the waiting position and the outlet at the front end of the anti-static liquid nozzle 725 is directed toward the center portion of the upper surface 91 of the substrate 9. Then, after a predetermined amount of anti-static liquid is supplied onto the upper surface 91 of the substrate 9 from the anti-static liquid nozzle 725, the supply of the anti-static liquid from the anti-static liquid nozzle 725 is stopped (a so-called puddle process is performed). The anti-static liquid supplied from the anti-static liquid nozzle 725 spreads from the center portion of the substrate 9 over the entire upper surface 91, and a thin film of the anti-static liquid 95 (having a thickness of e.g., about 1 mm) is thereby formed on the entire upper surface 91 and the entire upper surface 91 is puddled with the anti-static liquid 95 (Step S35). With this thin film formation, the electric charges on the upper surface 91 of the substrate 9 are relatively gently moved to the anti-static liquid 95 and the static elimination process is thus performed on the entire upper surface 91 of the substrate 9. The anti-static liquid 95 being in contact with the lower surface 92 of the substrate 9 and the anti-static liquid 95 being in contact with the upper surface 91 thereof are not continuous with each other on the substrate 9.

In the substrate processing apparatus 10b, the state in which the entire upper surface 91 of the substrate 9 is puddled with the anti-static liquid 95 and the entire lower surface 92 of the substrate 9 is in contact with the anti-static liquid 95 is maintained for a predetermined time period while the substrate rotating mechanism 5 stops, and the static elimination process is thus performed on the entire upper surface 91 of the substrate 9 and the entire lower surface 92 thereof.

After the static elimination process is finished, the rotation of the substrate 9 starts and the anti-static liquid on the upper surface 91 and the lower surface 92 of the substrate 9 is removed by the rotation of the substrate 9. It is thereby possible to prevent the anti-static liquid and the SPM liquid from being mixed on the upper surface 91 of the substrate 9 in the next SPM process. After the removal of the anti-static liquid is finished, the SPM liquid is supplied onto the upper surface 91 of the substrate 9 from the processing liquid supply part 3 shown in FIG. 7 and the SPM process is performed (Steps S16 and S17 in FIG. 3). Subsequently, after the hydrogen peroxide water is supplied onto the upper surface 91 of the substrate 9 from the processing liquid supply part 3 and the hydrogen peroxide water supplying process is thereby performed, the rinse liquid is supplied onto the upper surface 91 of the substrate 9 and the rinse process is thereby performed (Steps S18 and S19). The rinse liquid (deionized water) may be supplied from the not-shown rinse liquid supply part or from the anti-static liquid nozzle 725 of the anti-static liquid contacting part 7a. After that, the drying process for removing the rinse liquid remaining on the substrate 9 with the rotation of the substrate 9 is performed, and then the rotation of the substrate 9 is stopped (Steps S20 and S21).

Figure 10:
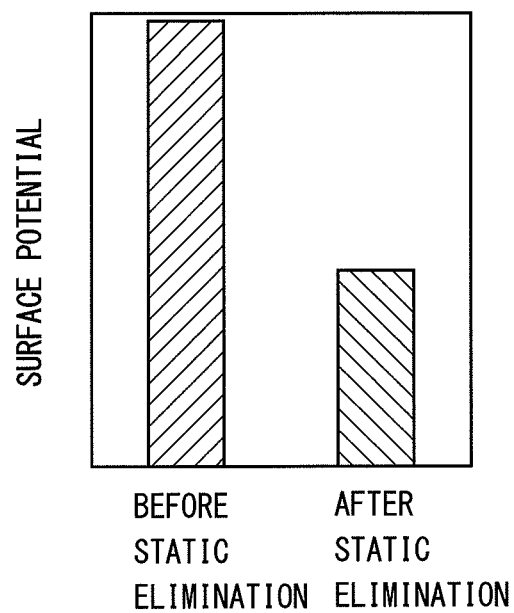
FIG. 10 is a graph showing surface potentials of the substrate before and after the static elimination process.

FIG. 10 is a graph showing surface potentials of the substrate 9 before and after the static elimination process in the substrate processing apparatus 10b. By performing the above-discussed static elimination process, the amount of the electric charges on the substrate 9 decreases and the potential of the substrate 9 is reduced on the whole. It is therefore possible to prevent any damage to the device due to the movement of the electric charges, i.e., any damage to the substrate 9 in the SPM process on the substrate 9 after being subjected to the static elimination process, like in the substrate processing apparatus 10 of FIG. 1. Further, in the substrate processing apparatus 10b, by providing the anti-static liquid contacting part 7a in the single-substrate processing apparatus 1, the size of the substrate processing apparatus 10b can be reduced. Furthermore, since the static elimination process is performed on the substrate 9 while the substrate rotating mechanism 5 substantially stops, it is possible to perform the static elimination of the substrate 9 with high efficiency. The state in which the substrate rotating mechanism 5 substantially stops includes, for example, a state in which the substrate rotating mechanism 5 rotates the substrate 9 at a very small number of revolutions and substantially no effect is produced on the layer of the anti-static liquid on the substrate 9 by that rotation.

Though the preferred embodiments of the present invention have been discussed above, the preferred embodiments allow various variations.

For example, in the static elimination process in the substrate processing apparatus 10b, the supply of the anti-static liquid onto the upper surface 91 and the puddle process may be performed while the substrate 9 is rotated only if the layer of the anti-static liquid on the upper surface 91 of the substrate 9 can be maintained, not being broken. Further, if the mixture of the anti-static liquid and the processing liquid causes no adverse effect, there may be a case where the processing liquid is supplied onto the upper surface 91 of the substrate 9 and a process is thereby performed on the substrate 9, before the anti-static liquid is removed in Steps S16 and S17.

In the substrate processing apparatuses of the above-discussed preferred embodiments, there may be a case where a processing liquid other than the SPM liquid is supplied onto the substrate 9 and any other process is thereby performed on the substrate 9. For example, buffered hydrofluoric acid (BHF) may be supplied as the processing liquid onto the substrate 9 having the resist film formed thereon and an etching process may be thereby performed on the substrate 9. In the substrate processing apparatuses, as discussed above, since it is possible to prevent any damage to the substrate 9 due to the rapid movement of the electric charges caused by the contact between the electrically charged substrate 9 and the processing liquid, the constitution of each of the substrate processing apparatuses is particularly suitable for an apparatus for performing a process using a processing liquid having very low electrical resistivity, such as the SPM liquid or the buffered hydrofluoric acid.

The ionic liquid used as the anti-static liquid is not limited to a solution in which carbon dioxide is dissolved in deionized water. For example, a solution in which ammonia is dissolved in deionized water or a solution in which a very small amount of dilute hydrochloric acid is added to deionized water may be used as the anti-static liquid, and liquids containing other various ions may be used as the anti-static liquid. Further, the anti-static liquid is not limited to the ionic liquid or deionized water but various kinds of liquids may be used as the anti-static liquid only if the electrical resistivity of the liquids is higher than that of the processing liquid.

In the substrate processing apparatuses, the target electrical resistivity of the anti-static liquid may be set on the basis of conditions (e.g., the kind(s) of process(es) performed on the substrate before the loading of the substrate into the substrate processing apparatus) other than the size of the device. Further, only if the static elimination process is performed by using an anti-static liquid having electrical resistivity higher than that of the processing liquid, it is not always necessary to maintain the electrical resistivity of the anti-static liquid at the target electrical resistivity. In this case, the electrical resistivity setting part 81 may be omitted.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2011-215259 filed in the Japan Patent Office on Sep. 29, 2011, the entire disclosure of which is incorporated herein by reference.

REFERENCE SIGNS LIST 2 substrate holding part
3 processing liquid supply part
7, 7a anti-static liquid contacting part
8 control part
9 substrate
10, 10a, 10b substrate processing apparatus
71, 71a anti-static liquid storage part
81 electrical resistivity setting part
91 upper surface
92 lower surface
95 anti-static liquid
725 anti-static liquid nozzle
761 lower surface liquid-contacting part
S11 to S20, S31 to S35 step

The invention claimed is:

1. A substrate processing apparatus for processing a substrate, comprising:
   a substrate holding part for holding a substrate;
   a processing liquid supply part for supplying a processing liquid onto a first main surface of the substrate on which a device has been formed in advance, said first main surface being one main surface of said substrate;
   an anti-static liquid contacting part for bringing said first main surface of said substrate and a second main surface which is the other main surface thereof into contact with an anti-static liquid having electrical resistivity higher than that of said processing liquid;
   a liquid removing part for removing liquid from said substrate by at least one of: drying said substrate, rotating said substrate, and providing another liquid to said substrate; and
   a control part configured to control said processing liquid supply part, said anti-static liquid contacting part and said liquid removing part to bring entire said first main surface and said second main surface of said substrate into contact with said anti-static liquid to thereby maintain a wetted state, to then remove said anti-static liquid from said substrate, and subsequently, to supply said processing liquid onto said first main surface of said substrate to thereby perform a process, wherein
   said anti-static liquid contacting part configured to said first main surface and said second main surface of said substrate into contact with said anti-static liquid, after said substrate has been subjected to a drying process and thereby electrically charged in advance before being loaded into said substrate processing apparatus.

2. The substrate processing apparatus according to claim 1, wherein
said anti-static liquid being in contact with said first main surface and said anti-static liquid being in contact with said second main surface are continuous with each other on said substrate.

3. The substrate processing apparatus according to claim 2, wherein
said anti-static liquid contacting part comprises an anti-static liquid storage part for storing said anti-static liquid therein, and
said substrate is immersed in said anti-static liquid stored in said anti-static liquid storage part to thereby bring said first main surface and said second main surface into contact with said anti-static liquid.

4. The substrate processing apparatus according to claim 3, wherein
a plurality of substrates which are arranged so that the directions of the normals of respective main surfaces thereof are directed to a horizontal direction are immersed in said anti-static liquid stored in said anti-static liquid storage part.

5. The substrate processing apparatus according to claim 3, further comprising:
an electrical resistivity setting part for setting target electrical resistivity of said anti-static liquid,
wherein said anti-static liquid is an ionic liquid or deionized water, and
with control by said control part, said first main surface and said second main surface of said substrate are brought into contact with said anti-static liquid while the ion concentration of said anti-static liquid is controlled to maintain the electrical resistivity of said anti-static liquid at said target electrical resistivity.

6. The substrate processing apparatus according to claim 1, wherein
said anti-static liquid contacting part comprises:
a first anti-static liquid contacting part for supplying said anti-static liquid onto said first main surface of said substrate which is held by said substrate holding part with said first main surface thereof directed upward to thereby puddle entire said first main surface with said anti-static liquid; and
a second anti-static liquid contacting part provided oppositely to said second main surface of said substrate, for discharging said anti-static liquid onto said second main surface to thereby maintain a contact state of entire said second main surface with said anti-static liquid.

7. The substrate processing apparatus according to claim 6, further comprising:
an electrical resistivity setting part for setting target electrical resistivity of said anti-static liquid,
wherein said anti-static liquid is an ionic liquid or deionized water, and
with control by said control part, said first main surface and said second main surface of said substrate are brought into contact with said anti-static liquid while the ion concentration of said anti-static liquid is controlled to maintain the electrical resistivity of said anti-static liquid at said target electrical resistivity.

8. The substrate processing apparatus according to claim 1, wherein
said processing liquid is an SPM liquid in which sulfuric acid which is heated and hydrogen peroxide water are mixed, and
said process is an SPM process.

9. The substrate processing apparatus according to claim 1, further comprising:
an electrical resistivity setting part for setting target electrical resistivity of said anti-static liquid,
wherein said anti-static liquid is an ionic liquid or deionized water, and
with control by said control part, said first main surface and said second main surface of said substrate are brought into contact with said anti-static liquid while the ion concentration of said anti-static liquid is controlled to maintain the electrical resistivity of said anti-static liquid at said target electrical resistivity.

10. The substrate processing apparatus according to claim 9, wherein
said target electrical resistivity set in said electrical resistivity setting part becomes higher as the size of said device becomes smaller.

11. The substrate processing apparatus according to claim 9, wherein
said anti-static liquid is said ionic liquid, and
said ionic liquid is a solution in which carbon dioxide is dissolved in deionized water.

12. The substrate processing apparatus according to claim 1, wherein
said anti-static liquid is a solution in which ammonia is dissolved in deionized water or a solution in which dilute hydrochloric acid is added to deionized water.

13. The substrate processing apparatus according to claim 1, wherein
said liquid removing part comprises a substrate drying part for performing a drying process on said substrate.

14. The substrate processing apparatus according to claim 1, wherein
said control part is a programmed computer.

* * * * *